United States Patent [19]

Broburg et al.

[11] 4,074,204
[45] Feb. 14, 1978

[54] EQUALIZING AMPLIFIER

[75] Inventors: Gregory W. Broburg, White Bear Lake; Allen C. Clark, Minneapolis, both of Minn.

[73] Assignee: Van Alstine Audio Systems, Inc., Burnsville, Minn.

[21] Appl. No.: 743,977

[22] Filed: Nov. 22, 1976

[51] Int. Cl.² ............................................. H03F 1/36
[52] U.S. Cl. .................................. 330/109; 330/98; 330/107
[58] Field of Search ................. 330/21, 28, 98, 107, 330/109, 75

[56] References Cited

U.S. PATENT DOCUMENTS 3,863,173   1/1975   Scheib et al. .................. 330/107 X

*Primary Examiner*—Lawrence J. Dahl
*Attorney, Agent, or Firm*—Neil B. Schulte

[57] ABSTRACT

A fully passive frequency contouring amplifier using segregated passive networks to shape the different portions of the signal thus avoiding all phase distortion and permitting the stages to be coupled without coupling capacitors, thus avoiding distortion caused by the non-linearities of capacitors. In addition, a special DC servo loop is used to drastically reduce DC amplification.

7 Claims, 1 Drawing Figure

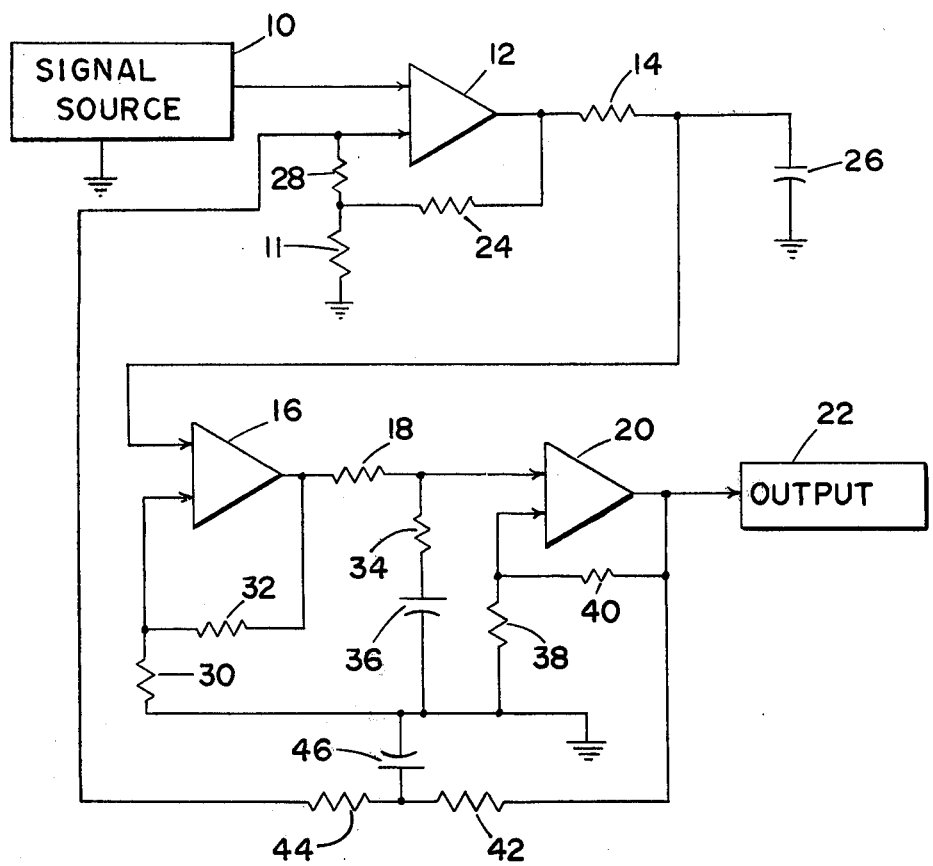

EQUALIZING AMPLIFIER

BACKGROUND OF THE INVENTION

Our invention contemplates a frequency contouring amplifier circuit which may be applied to any situation in which it is desired to amplify certain frequencies differently from other frequencies. The circuit has particular utility in the signal processing art such as associated with music reproduction. In this specification the circuit is described with respect to its use as an equalizing amplifier for shaping the signal from a phonograph cartridge signal source. Used in the preamplifier circuit the present invention has been found to reproduce music with a higher degree of quality than has heretofore been observed. It should be remembered, however, that the circuit has wide utility beyond the high fidelity music reproduction field and is not intended to be limited to this use.

To ease certain difficulties in the recording process both with records and tapes it is known in the industry to record sound in such a way that high frequencies receive a great deal more volume or amplitude than the lower frequencies. In fact, there exists an RIAA established curve for determining the ratios between the amplitudes of the various frequency signals which has been accepted as an industry standard and is used by all manufacturers. In this curve frequencies above 2122 hertz are recorded at progressively higher amplitudes in proportion to the frequency. A second break in the curve is established from 50 hertz to 500 hertz. Thus, in effect, the music is recorded in the form of an encoded signal which must be decoded by the playing equipment before it can be properly reproduced. By far the most common way to decode the signal in the playing unit is to utilize a preamplifier circuit in which the amplified signal is fed back to the input of the amplifier in a selective manner by means of a combination of resistors and capacitors and often more complicated circuits so as to selectively supress the higher frequencies. This is known as a frequency dependent feedback system and produces only an adequate signal. Whenever any capacitive feedback system is employed it is impossible to avoid induced time lag distortion which prevents the achievement of the highest fidelity signal.

An alternative approach to eliminating some of the higher frequency signals involves a passive filter network which attenuates some of the higher energy components by selectively attenuating them with suitably chosen resistors and capacitors. Since the capacitor is not a part of the amplifying circuit there is no harmful signal distorting feedback. However, this system suffers disadvantages in that the passive network draws off a considerable amount of energy and therefore a large amount of amplification is required. It turns out that the amount of amplification required usually results in clipping the signal on the higher frequencies in order to obtain sufficient amplification for the lower frequencies. This comes about as a direct result of the RIAA accepted recording standard which results in a signal having approximately one hundred times the amplitude for the higher frequencies (near 20 KHz) than for the lower frequencies (near 20 hertz). Accordingly, in the prior art it has become common to revert to the active feedback type system and then provide complex circuits designed to eliminate the distortion effect produced thereby. Sometimes these circuits are so complex they involve hundreds of components. Since all circuit components inherently have some minimum noise and some minimum inherent nonlinearities themselves, the law of diminishing returns sets in wherein the more one trys to eliminate the distortion effects the more noise is created and the minimum distortion based on real-life nonlinearities is greatly increased. Our invention avoids these problems by the novel use of an amplification circuit in which several passive networks may be used in a segregated manner as described hereinafter.

SUMMARY OF THE INVENTION

Briefly, the present invention utilizes several stages of amplification connected together by resistive means only and employing no capacitors in the signal path. The complete avoidance of feedback capacitors ensures the complete avoidance of time lag distortion due to the phase shifts generated in resistive-capacitance feedback circuits. The first stage of amplification is chosen to operate well within its range to avoid clipping and noise. After the first stage a portion of the high frequency spectrum is attenuated by means of a suitable passive network. This eliminates some of the radical difference in amplitude between the low and high frequencies so that a second stage amplifying means can be used to increase the signal again without danger of clipping or induced noise. After the second stage of amplification a passive network again can be used to attenuate another portion of the higher frequencies so as to shape the signal back to a curve similar to the natural sound originally recorded. Clearly, any number of stages could be used depending upon the complexity of the signal contour involved but the present invention is shown with three stages only to illustrate the basic principles involved.

It is contemplated that the present invention would use operational amplifiers for its amplifying means connected together by passive elements only. In this embodiment the passive elements comprise only resistors in the signal path with capacitors used only for shunting. This avoids any capacitors in the signal path. Normally this would be considered bad practice due to the objectional amplification of DC components in the signal. Normally these DC components are eliminated by a capacitor between the output of one operational amplifier and the input of the next operational amplifier. Accordingly, we additionally contemplate in our invention the use of a DC servo loop circuit coupled from the output of the amplifier back to the input so as to automatically eliminate any Dc output. It may therefore be seen that it is an object of our invention to provide an improved amplifying circuit which can frequency contour a signal in any desired manner. It is a further object of our invention to provide a fully direct coupled amplifying circuit with fully passive frequency shaping means expecially suitable for applications such as high fidelity reproduction and as an equalizing preamplifier. It is still a further object of our invention to provide such a frequency contouring amplifying means with a multistage DC coupled servo loop to avoid the unwanted amplification of DC signals. Further objects and advantages will become apparent from the following description and drawing.

BRIEF DESCRIPTION OF THE DRAWING

The drawing shows a schematic diagram of the circuit of this invention in its simplest form so as to easily demonstrate the principles of our invention.

DESCRIPTION OF THE PREFERRED EMBODIMENT

In the drawing one embodiment of the invention is shown utilizing three amplification stages. A signal source 10 which may be, for example, a phono cartridge, presents a signal to a first amplifying means 12. The signal is amplified and coupled through a resistor 14 to a second amplifying means 16. This signal is then coupled through a resistor 18 to a third amplifying means 20 and presented to the output 22. It should be noted that the entire signal path includes no capacitive connections at all so that no distortion is introduced into the signal. In the preferred embodiment amplifying means 12, 16, and 20 comprise high input impedance gain blocks which could be provided by operational amplifiers of the type well known to those skilled in the art. Negative feedback to control the first amplification stage is provided by the resistors 11, 24, 28, and 44 which set the gain. Again no capacitors are used which could induce time lag distortion. Accordingly amplifier 12 amplifies equally across the range of frequencies encountered but is designed to operate well within a range to avoid clipping. A first passive network comprising resistor 14 and a capacitor 26 is used to attenuate the higher frequency components of the signal before presentation to the second amplifying stage 16. Feedback for amplifier 16 is provided by a resistance network comprising resistors 30 and 32. Again it will be noticed that no capacitors need be employed. Now that the relative difference in magnitude between the high frequency and low frequency components of the signal has been somewhat reduced, amplifier 16 can be used to amplify the signal some more without and danger of clipping or time lag distortion. The signal is then further treated by a second passive signal shaping network comprising resistors 18 and 34 and a capacitor 36. Capacitor 36 like capacitor 26 operates to attenuate a selected portion of the signal. Since the preferred embodiment is operating to equalize the RIAA standard signal, in the preferred embodiment capacitor 36 is chosen to operate on the 50 hertz to 500 hertz portion of the signal and flatten the overall response sufficiently so that it can be presented to output 22 by amplifier 20. Amplifier 20 is controlled by a feedback resistor 40 operating in conjunction with resistor 38. It is possible that operational amplifiers 12, 16, and 20 will also amplify objectional DC signals since no blocking capacitors are used in the signal path. Accordingly, our invention utilizes an automatic multistage DC coupled servo loop connected from the output of amplifier 20 through a pair of resistors 42 and 44 to the input of amplifier 12. A capacitor 46 is used to selectively attenuate AC of frequency greater than .1 hertz. The servo loop is directed back to the input of amplifier 12 to automatically compensate and drastically reduce any DC output voltages. Because of the separate passive filter stages it is not necessary to operate any of the amplifiers at a range in which they might overload for some frequencies. Furthermore a circuit has been provided in which there are no capacitors in the signal path and no active filters which could induce signal distortions. Of course, a more complex contour effect could be achieved with additional stages as required and other changes could be made to the circuit without departing from the spirit and scope of the invention and therefore we intend to be limited only to the following claims.

We claim:

1. A frequency contouring amplifier comprising:
   a first amplifying means having an input connected to receive the signal and having an output, said first amplifying means increasing the entire spectrum of the signal;
   a first passive filter network connected to the output of said first amplifying means so as to attenuate the portion of the signal above 2122 Hertz;
   a second amplifying means having an input connected to the output of said amplifying means and having an output, said second amplifying means increasing the entire spectrum of the signal received from said first amplifying means as attenuated by said first filter network;
   a second passive filter network connected to the output of said second amplifying means so as to attenuate the portion of the signal from 50 to 500 Hertz; and
   at least one third amplifying means connected to the output of the second amplifying means to produce a low impedance frequency contoured output signal, said third amplifying means increasing the entire spectrum of the signal received from said second amplifying means as attenuated by said second passive filter network.

2. The circuit of claim 1 in which said amplifying means are connected together output to input only by resistive means.

3. The circuit of claim 2 including an automatic multistage DC coupled servo loop from the output of the last amplifying means to the input of said first amplifying means which servo loop includes a third passive filter means to attenuate most of the AC signal.

4. The circuit of claim 2 in which said amplifying means comprise operational amplifiers.

5. The circuit of claim 3 in which said amplifying means comprise operational amplifiers.

6. The circuit of claim 4 including purely resistive feedback circuits for controlling the gain of the amplifiers.

7. The circuit of claim 5 including purely resistive feedback circuits for controlling the gain of the amplifiers.

* * * * *